(12) United States Patent
McLean

(10) Patent No.: US 11,586,419 B2
(45) Date of Patent: Feb. 21, 2023

(54) DYNAMIC PSEUDO-RANDOM BIT SEQUENCE GENERATOR AND METHODS THEREFOR

(71) Applicant: ATI TECHNOLOGIES ULC, Markham (CA)

(72) Inventor: Daniel Harvey McLean, Markham (CA)

(73) Assignee: ATI TECHNOLOGIES ULC, Markham (CA)

( * ) Notice: Subject to any disclaimer, the term of this patent is extended or adjusted under 35 U.S.C. 154(b) by 246 days.

(21) Appl. No.: 17/029,747

(22) Filed: Sep. 23, 2020

(65) Prior Publication Data

US 2021/0405972 A1 Dec. 30, 2021

Related U.S. Application Data

(60) Provisional application No. 63/044,547, filed on Jun. 26, 2020.

(51) Int. Cl.
*G06F 7/58* (2006.01)
*H03K 19/21* (2006.01)
*H03K 3/84* (2006.01)

(52) U.S. Cl.
CPC ............... *G06F 7/582* (2013.01); *H03K 3/84* (2013.01); *H03K 19/21* (2013.01)

(58) Field of Classification Search
None
See application file for complete search history.

(56) References Cited

U.S. PATENT DOCUMENTS 5,153,532 A * 10/1992 Albers ..................... H03K 3/84
331/78
9,747,076 B1 * 8/2017 Yang ....................... G06F 7/584

* cited by examiner

*Primary Examiner* — Daniel C Puentes

(57) ABSTRACT

A processing system includes a pseudo-random bit sequence (PRBS) control unit and a PRBS generator that is used to dynamically generate a PRBS from, for example, a first PRBS and a second PRBS. The PRBS generator is coupled to the PRBS control unit. The PRBS generator generates the second PRBS by dynamically adjusting from a first set of flip-flops of a master set of flip-flops that generate the first PRBS to a second set of flip-flops of the first master set of flip-flops that generate the second PRBS. The PRBS generator includes a plurality of PRBS logic engines coupled to a first PRBS multiplexer, the first PRBS multiplexer being used to select either the first PRBS or the second PRBS that is output by the PRBS generator.

18 Claims, 5 Drawing Sheets

DYNAMIC PSEUDO-RANDOM BIT SEQUENCE GENERATOR AND METHODS THEREFOR

CROSS-REFERENCE TO RELATED APPLICATIONS

The present application claims priority to Provisional Patent Application Ser. No. 63/044,547, entitled "DYNAMIC PSEUDO-RANDOM BIT SEQUENCE GENERATOR AND METHOD THEREFOR" and filed on Jun. 26, 2020, the entirety of which is incorporated by reference herein.

BACKGROUND

Pseudo-random bit sequences (PRBSs) are sequences of bits that are generated pseudo-randomly as test patterns to test communication channels or circuits used in processing systems. The test patterns are typically generated using a Linear Feedback Shift Register (LFSR), which is a shift register having as an input bit a linear function of its previous state. LFSRs are generally implemented using flip-flops in a single bit per clock cycle topology. However, in systems that require increased throughput, the LFSR is generally implemented in parallel to "shift" multiple bits at a time. Using LFSRs in parallel is problematic due to the increased number of flip-flops required to implement the multiple data widths, often rendering the usage of a conventional LFSR impracticable.

BRIEF DESCRIPTION OF THE DRAWINGS

The present disclosure is better understood, and its numerous features and advantages made apparent to those skilled in the art by referencing the accompanying drawings. The use of the same reference symbols in different drawings indicates similar or identical items.

DETAILED DESCRIPTION

FIGS. 1-5 illustrate systems and methods for generating a pseudo-random bit sequence (PRBS) using a pseudo-random generator in a processor system. One or more PRBSs are generated by the PRBS generator using varying polynomial functions for each PRBS requested. The polynomial functions are mapped to "PRBS topologies" that are representative of the order of the varying polynomial functions. To generate PRBSs that correspond to the varying polynomial functions, the PRBS generator is configured to utilize next-state values (values that represent the next-state of bits that are to be used to generate the PRBS) output from an adjustable number of flip-flops with exclusive-OR (XOR) feedback. For example, in some embodiments, to provide a PRBS corresponding to a first polynomial, the next-state value output of a first set of flip-flops in state logic (i.e., a master set of flip-flops in the PRBS generator used to store the next-state values) that correlate to the flip-flops required to generate the first polynomial are provided to a first XOR tree. The next-state value output is fed back into the state logic and the first XOR tree to generate the PRBS corresponding to the first polynomial. To provide a PRBS corresponding to a second polynomial, the output of a second set of flips flops of the master set of flip-flops in state logic that correlate to the flip-flops required to generate the second polynomial are provided to a second XOR tree. The next-state value output is fed back into the state logic and the second XOR tree to generate the PRBS corresponding to the second polynomial. By providing the output of the first set of flip-flops of the master set of flip-flops to the first XOR tree and feeding the output of the first XOR tree to the master set of flip-flops, and providing the output of the second set of flip-flops of the master set of flip-flops to the second XOR tree and feeding the output of the second XOR tree to the master set of flip-flops, the PRBS generator is able to generate a PRBS corresponding to various polynomials using a single master set of flip-flops.

Further, in order to dynamically adjust the data width provided at the output of the PRBS logic engine, data width multiplexers are used in combination a plurality of XOR trees to select the desired width of the data to be output at the PRBS logic engine. For example, in some embodiments, for a requested output data width of 8 bits, the data width multiplexer is used to select an output of a PRBS logic unit that uses a first XOR tree to provide the 8-bit data width. In another embodiment, for example, for a desired output data width of 32 bits, the data width multiplexer is used to select an output of a PRBS logic unit that uses a second XOR tree to provide the 32-bit data width. Thus, the PRBS generator is able to generate PRBSs by dynamically adjusting for varying polynomial functions of varying dynamic data widths.

Figure 1:
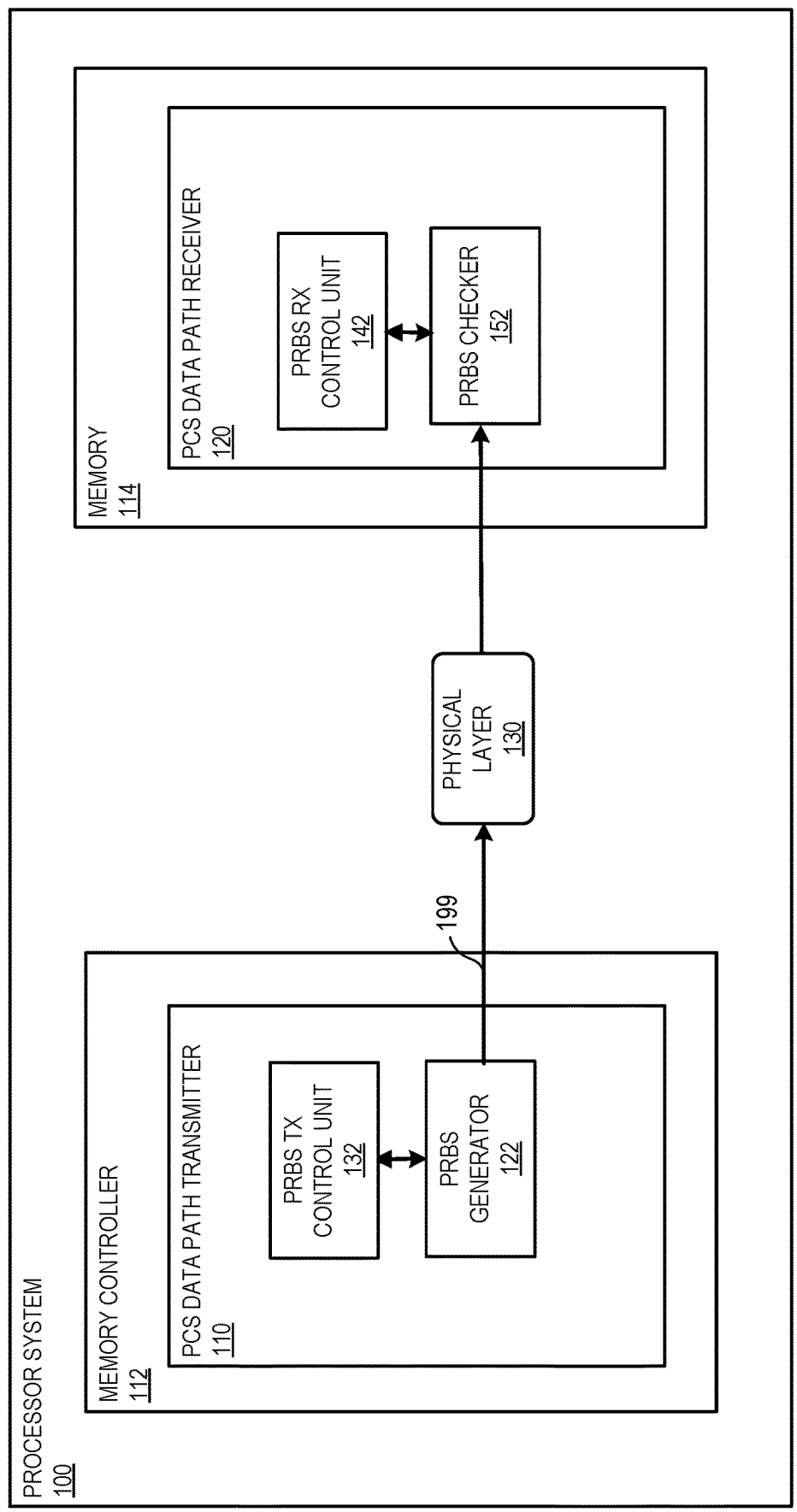
FIG. 1 is a block diagram of a processor system that uses a pseudo-random bit sequence generator to generate a pseudo-random bit sequence in accordance with some embodiments.

FIG. 1 is a block diagram of a processor system 100 implementing a pseudo-random bit sequence (PRBS) generator 122 that generates pseudo-random bit sequences in accordance with some embodiments. The processor system 100 includes a memory controller 112, and a memory 114, which includes an application-appropriate amount of dynamic random access memory (DRAM). The processor system 100 also includes, although not shown, one or more central processing units (CPUs), graphical processing units (GPUs), or processing cores, one or more input/output (I/O) controllers, and a Northbridge. The processor system 100 also typically includes I/O devices coupled to the I/O controllers (not shown). In some embodiments, the I/O devices are, for example, a hard-drive, I/O port, network device, keyboard, mouse, graphics card, etc. In selected embodiments, the memory 114 is a shared system resource that is coupled to the memory controller 112. In some embodiments, the memory controller 112 is broadly considered a resource scheduler. It will be appreciated that the techniques disclosed herein are broadly applicable to processor systems that include the CPUs, each of which, in some embodiments, has one or more levels of internal cache. The techniques disclosed herein are broadly applicable to processor systems that include any number of I/O controllers. In some embodiments, the memory controller 112 is, for example, a dynamic random access memory (DRAM) controller, in which case the memory 114 includes multiple DRAM modules. In some embodiments, the memory controller 112 is integrated within the Northbridge or is located in a different functional block of the processor system 100. In some embodiments, the I/O controllers are HyperTransport controllers. In general, the processor system 100 includes various devices that read/write information from/to the memory 114. In a typical implementation, the memory 114 is partitioned into a number of different rank/bank pairs, where the rank corresponds to a chip select. For example, in some embodiments, a DRAM channel has four ranks per channel with eight banks per rank, which corresponds to thirty-two independent information states that need to be tracked to choose an incoming request schedule that provides an optimal performance. In selected embodiments, the processor system 100 implements more than one DRAM channel.

Memory controller 112 of processor system 100 includes a physical coding sublayer (PCS) data path transmitter (TX) 110 that is coupled to a physical layer 130. Memory 114 includes a PCS data path receiver (RX) that is coupled to the physical layer 130. PCS data path TX 110 includes a PRBS TX control unit 132 coupled to a PBRS generator 122. PRBS generator 122 is configured to generate a PRBS 199 at the output of PCS data path TX 110 to test the channel (e.g., physical layer 130) in the processor system 100. In some embodiments, the PRBS is requested by a user of the PRBS generator 122, e.g., a computer programmer or computer program that utilizes the PRBS generator 122. The PRBS 199 output by the PRBS generator 122 is generated based on a selection of a PRBS made at the PRBS generator 122. The PRBS corresponds to a "PRBS topology" that is representative of an order of a polynomial function or polynomial functions that are used to generate the pseudo-random bit sequences. PCS data path receiver (RX) 120 includes a PRBS RX control unit 142 coupled to a PRBS checker 152. PRBS checker 152 of PCS data path RX 120 is configured to use the PRBS 199 to determine whether errors exists in physical layer 130.

In some embodiments, in operation, to facilitate commencement of the process of generating the PRBS 199, PRBS control unit 132 receives a request to generate a number of PRBS topologies that are required by the user of the PRBS generator 122. In addition, in some embodiments, the user of the PRBS generator 122 requests or selects a plurality of pseudo-random bit sequences for generation by PRBS generator 122. The pseudo-random bit sequences are generated by PRBS generator 122 using a polynomial function for each pseudo-random bit sequence requested. The polynomial functions are mapped to the "PRBS topologies" that, as state previously, are representative of the order of the polynomial functions. For example, in some embodiments, for a selection of a $31^{st}$ order polynomial, the polynomial is defined by the expression $x^{31}+x^{18}+1$ and the PRBS 199 that is generated by PRBS generator 122 is referenced as a PRBS-31 sequence for a PRBS-31 topology. In some embodiments, for a selection of a $15^{th}$ order polynomial, the polynomial is defined by the expression $x^{15}+x^{13}+1$ and the PRBS 199 that is generated by PRBS generator 122 is referenced as a PRBS-15 sequence a PRBS-15 topology. In some embodiments, for a selection of a $7^{th}$ order polynomial, the polynomial is defined by the expression $x^{7}\pm x^{6}+1$ and the PRBS 199 that is generated by PRBS generator 122 is referenced as a PRBS-7 sequence for a PRBS-7 topology.

In some embodiments, the PRBS generator 122 is configured to implement state logic that utilizes a dynamic linear feedback shift register (DLFSR) and dynamically selected PRBS logic engines (depicted in detail with reference to FIGS. 2 and 4) to implement the polynomial functions that are used to generate the pseudo-random bit sequences. The DLFSR is configured to include a plurality of flip-flops that are used to store next-state values that are fed back through PRBS logic engines to the DLFS to generate the PRBS. The PRBS logic engines are configured to utilize XOR trees (i.e., trees of XOR gates) with varying inputs from the state logic to dynamically adjust the number of flip-flops that are used to implement the polynomial functions and generate the PRBS 199 output by PRBS generator 122. In some embodiments, for example, if the PRBS logic engine in PRBS generator 122 is currently implementing a $15^{th}$ order polynomial function using 15 flip-flops in the DLFSR, when the user requests, for example, a $7^{th}$ order polynomial to generate the PRBS, the dynamically selected PRBS logic engine is adjusted to implement a $7^{th}$ order polynomial function using 7 of the 15 flip-flops of the DLFSR. In some embodiments, each PRBS logic engine has a maximum number of flip-flops (DLFSR size) available to generate the pseudo-random bit sequences that are mapped to the polynomial functions.

In some embodiments, upon initialization of the PRBS generator 122, the DLFSR size is equal to the number of flip-flops available for the largest PRBS topology. For example, in some embodiments, if there are 31 flip-flops available in the DLFSR, then the maximum number order of the polynomial function that implemented by PRBS generator 122 is 31. That is, assuming, for example, the PRBS generator 122 is configured to implement a $31^{st}$ order polynomial at its maximum, the maximum number of flip-flops used in the DLFSR is 31. Similar to the previous example, when the PRBS sequence requested for testing is a PRBS-7, i.e., a $7^{th}$ order PRBS sequence, PRBS generator 122 adjusts the number of flip-flops selected to generate the $7^{th}$ order PRBS sequence to 7 flip-flops. The adjustment of the number of flip-flops that are used to generate the PRBS from a first number of flip-flops (a first flip-flop value) to a second number of flip-flops (a second flip-flop value) occurs by adjusting the implementation location of XOR trees in the PRBS logic engines (depicted as PRBS logic engines 210 in FIG. 2).

In some embodiments, in addition to being able to dynamically adjust the number of flip flops that are used to accommodate for varying orders of polynomial functions, the PRBS generator 122 is configured to dynamically adjust the data width of the pseudo-random bit sequences provided at the output of the PCS data path TX 110 to a data width selected by the user of the PRBS generator 122. The data width of the pseudo-random bit sequence provided at the output of PCS data path TX 110 is adjusted by configuring the XOR trees of each PRBS logic engine to generate a specific data width. For example, in some embodiments, if the user selects a PRBS sequence for a PRBS-7 with a 32-bit data width, the PRBS logic engine uses an XOR tree configured to generate 32 bits with 7 inputs from the flip-flops of the DLFSR that correspond to the $7^{th}$ order polynomial. If the user selects a PRBS sequence for a PRBS-7 with a 16-bit data width, the PRBS logic engine uses an XOR tree configured to generate 16-bits with 7 inputs from the flip-flops of DLFSR that correspond to the $7^{th}$ order polynomial. The dynamic adjustment allows the PRBS generator 122 to generate PRBS test sequences of varying widths without additional flip-flops being added to the circuitry.

After the PRBS 199 is generated by PRBS generator 122, the selected PRBS 199 is transmitted through, for example, physical layer 130, and received by PRBS checker 152. PRBS checker 154 is a PRBS checking system that receives the test sequence (PRBS 199) output by the PCS data path TX 110 and assesses the transmitted PRBS sequence to determine whether there are any errors in the transmitted PRBS sequence. The PCS data path RX 120 or PCS data path TX 110 implements error correction techniques to correct the errors caused by, for example, the communication channel.

Figure 2:
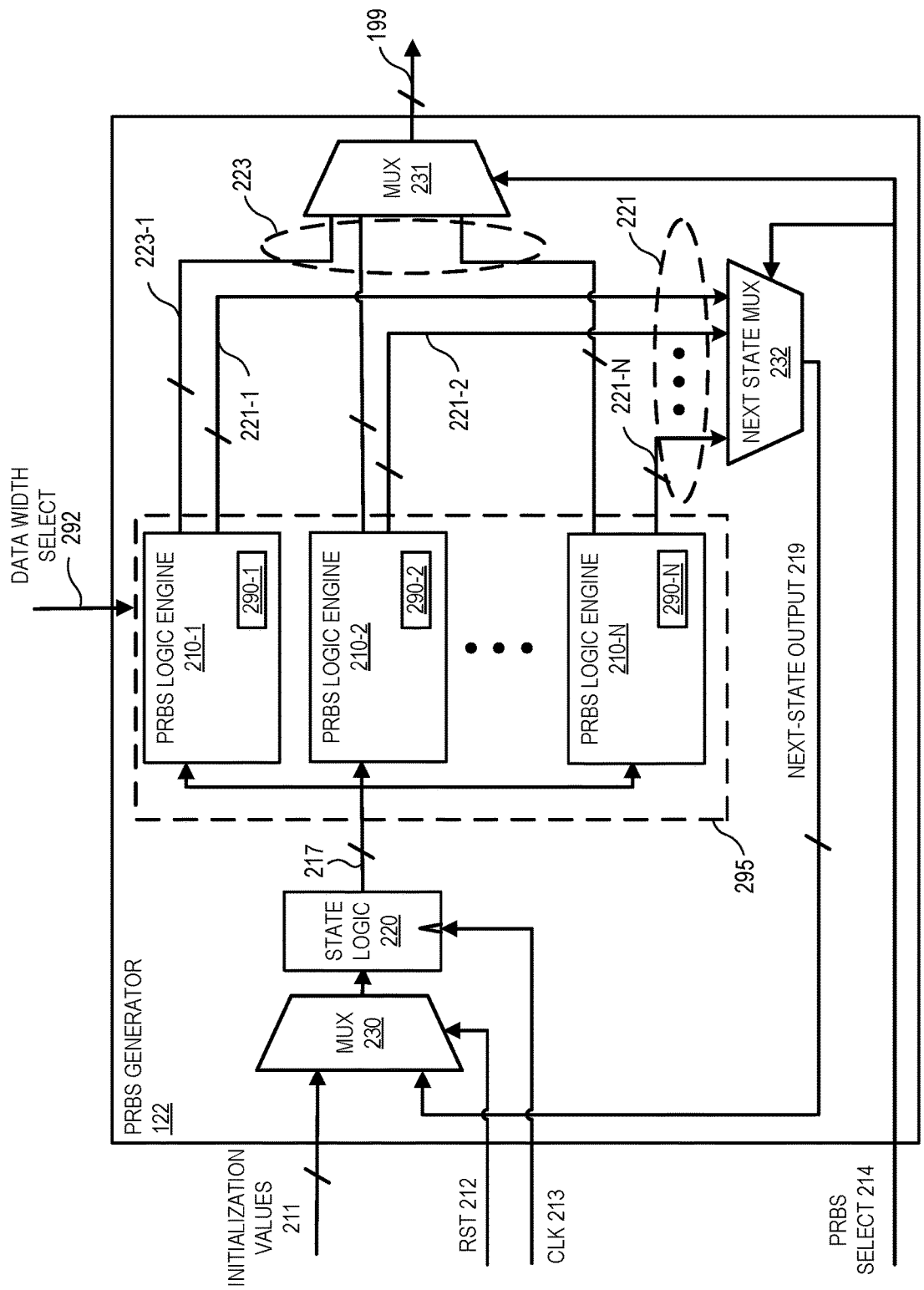
FIG. 2 is a block diagram of a pseudo-random bit sequence generator of the processor system of FIG. 1 in accordance with some embodiments.

FIG. 2 is a block diagram of the PRBS generator 122 of FIG. 1 in accordance with some embodiments. PRBS generator 122 includes a multiplexer (MUX) 230, state logic 220, PRBS logic engines 210-1-210-N, a PRBS select MUX 231, and a next-state MUX 232. In some embodiments, MUX 230 is coupled to state logic 220. State logic 220 is coupled to PBRS logic engines 210-1-210-N. PRBS logic engines 210-1-210-N are coupled to PRBS select MUX 231 and PRBS next-state MUX 232. In some embodiments, the number N of PRBS logic engines 210 in PRBS generator 122 is equivalent to the number of PRBS topologies or PRBS test sequences requested or selected by the user of PRBS generator 122. For example, when the user of PRBS generator 122 requests 5 PRBS topologies, N is equal to the number 5.

In operation, PRBS generator 122 receives a PRBS select signal 214, initial state signals (initialization values) 211, a reset signal 212, a data width select signal 292, and a clock signal 213 from PRBS TX control unit 132 (depicted in PCS data path TX 110 of FIG. 1). The clock signal 213 is a clock signal provided to PRBS generator 122 that is used to clock a plurality of flip-flops in state logic 220 that store next-state values (described further below with reference to FIGS. 3 and 4) located in state logic 220. Initialization values 211 are provided to MUX 230 of PRBS generator 122 to provide initial state values to the flip-flops in state logic 220. Reset signal 212 is provided as a reset signal to reset MUX 230. In some embodiments, a PRBS configuration signal (not shown) is a signal provided to the PRBS logic engines 210 to configure the PRBS configurations or topologies requested by the user. Data width select signal 292 is a signal provided to the PRBS logic engines 210 of dynamically selected PRBS logic engines (DSPLE) 295 to select the data width of the PRBS requested by the user. PRBS select signal 214 is provided to PRBS select MUX 231 to select the PRBS logic engine 210 (indicative of the PRBS topology) requested by the user of PRBS generator 122. The PRBS select signal 214 that corresponds to the PRBS logic engine 210 selected by the user is also provided to next-state MUX 232 to select the next-state values that are provided via feedback to state logic 220.

In some embodiments, prior to selecting the PRBS sequence to be output by the PRBS generator 122, the user of PRBS generator 122 (using, e.g., PRBS configuration signal (not shown) requests or determines the number of PRBS topologies and the PRBS topologies to be structured by PRBS generator 122. In some embodiments, for example, when the user of PRBS generator 122 requests 5 PRBS topologies corresponding to 5 PRBS test sequences, with the first PRBS sequence being a PRB S-7 sequence, the second PRBS sequence being a PRB S-9 sequence, the third PRBS sequence being PRB S-11 sequence, the fourth PRBS sequence being a PRB S-23 sequence, and the fifth PRBS sequence being a PRBS-31 sequence, then PRBS generator 122 receives the PRBS configuration signal and generates 5 PRBS logic engines 210 in DSPLE 295 and structures each such that each PRBS logic engine 210 is indicative of the requested topology for the corresponding PRBS sequence. In some embodiments, for example, the PRBS generator 122 receives the PRBS configuration signal (not shown) and dynamically adjusts the DSPLE 295 such that the output of the first PRBS logic engine 210-1 is a PRBS-7 sequence (corresponding to a PRB S-7 logic topology), the output of the second PRBS logic engine 210-2 is a PRBS-9 sequence (corresponding to a PRBS-9 logic topology), the output of the third PRBS logic engine 210-3 is a PRBS-11 sequence (corresponding to a PRBS-11 logic topology), the output of the fourth PRBS logic engine 210-4 is a PRBS-23 sequence (corresponding to a PRBS-23 logic topology), and the output of the fifth PRBS logic engine 210-5 is a PRBS-31 sequence (corresponding to a PRBS-31 logic topology).

In some embodiments, when a specific PRBS sequence is requested, the PRBS generator 122 receives the PRBS select signal 214 (indicative of the PRBS logic engine 210 selected by the user) at PRBS select MUX 231 and next-state MUX 232 and the data width select signal 292 (indicative of the data width of the output PRBS sequence) at DSPLE 295. Using the PRBS select signal 214 and the data width select signal 292, the PRBS generator 122 generates and selects the pseudo-random bit sequence 223 using the PRBS logic engines 210 as output PRBS sequence 199 that corresponds to the requested PRBS topology and data width requested by the user at the output of PRBS generator 122.

In some embodiments, to facilitate the generation of the requested PRBS 199 at the output of MUX 231, the PRBS logic engines 210 of PRBS generator 122 are configured to utilize XOR trees 290 (depicted further in detail in FIGS. 3 and 4) that input next-state values 217 fed back from state logic 220 via next-state MUX 232. The XOR trees are constructed using a network of XOR gates whose structure is based on the polynomial corresponding to the PRBS sequence to be output by the PRBS logic engine 210 and the data width that is selected by the user. For example, in some embodiments, each XOR tree of PRBS logic engines 210 inputs only the next-state values of next-state values 217 from the flip-flops in state logic 220 that correspond to the polynomial selected by the user. In order to select the next-state values of next-state values that are provided to the state logic 220, the PRBS select signal 214 is provided to next-state MUX 232 to select the next-state values of next-state values 221-1-221-N that correspond to the selected PRBS logic engine 210 and provide the next-state values as next-state values 219 to MUX 230 via feedback to state logic 220. The next-state values 219 are stored in the flip-flops of state logic 220 for use as next-state values that are input to the XOR trees 290 of PRBS logic engines 210 during each clock cycle. That is, during each clock cycle, each of PRBS logic engines 210 receives the next-state values from state logic 220. The number of next-state values stored and output by state logic 220 corresponds to the maximum number of flip-flops available for generation of the polynomial requested. However, the number of next-state values that are used or input by each XOR tree of the XOR trees 290 in each PRBS logic engine 210 to generate the PRBS sequence corresponds to the order number of the PRBS sequence requested. For example, in some embodiments, for a $31^{st}$ order polynomial, there are 31 flip flops in state logic 220 and 31 next-state values 217 that are provided as input to PRBS logic engines 210. The PRBS logic engines 210 receive the 31 next-state value bits as feedback from the 31 flip flops in state logic 220 and, in this case, the PRBS logic engine 210 that corresponds PRBS selected (PRBS-31) uses the 31 next-state value bits as input to the XOR trees to generate the PRBS sequence. In some embodiments, for example, for a $7^{th}$ order polynomial, there are 31 flip flops and 31 next-state values that are provided to PRBS logic engines 210. The PRBS logic engines 210 receive the 31 next-state value bits as feedback from the 31 flip flops in state logic 220 and, in this case, the PRBS logic engine 210 that corresponds PRBS selected (PRBS-7) use 7 next-state values of the 31 next-state values as input to the XOR trees to generate the PRBS sequence. Thus, the next-state MUX 232 uses the PRBS select signal 214 to select the PRBS logic engine whose next-state value output (next-state values 221) is used as feedback into the flip-flops of state logic 220 for use by PRBS logic engines 210 during the next or subsequent clock cycle.

In some embodiments, when alternative PRBS sequences are requested to be output by the PRBS logic engines 210, the PRBS generator 122 uses MUX 231 to dynamically adjust the selection of the PRBS logic engines 210 such that the output of PRBS logic engine 210-1-210-N is the newly requested PRBS sequence. As stated previously, the dynamic adjustment allows the PRBS generator 122 to generate varying PRBS sequences at the output of MUX 231 without additional flip-flops being added to the circuitry as is customary in typical parallel LFSR designs.

In addition to MUX 231 and next-state MUX 232 of PRBS generator 122 receiving the PRBS select signal 214 to dynamically adjust PRBS sequence that is output by the PRBS generator 122, the PRBS logic engine 210 of PRBS generator 122 receives data width select signal 292 to dynamically adjust the data width of the pseudo-random bit sequence to the data width selected by the user of the PRBS generator 122. In order to dynamically adjust the data width of the pseudo-random bit sequences to the data width selected by the user of the PRBS generator 122, each PRBS logic engine 210-1 through 210-N in PRBS generator 122 receives data width select signal 292 from PRBS TX control unit 132 and, utilizing the XOR trees 290 in PRBS logic units 320 (referenced in FIGS. 3 and 4), outputs a PRBS 223 and next-state values 221 of the requested data width. For example, when PRBS logic engine 210-1 receives data width select signal 292 requesting a 16-bit wide PRBS-7, a MUX located in PRBS logic engine 210 is used to select output from an XOR tree that is configured to use a network of XOR gates to output a 16-bit PRBS-7. Thus, the data width of the pseudo-random bit sequence provided at the output of PCS data path TX 110 is adjusted by configuring the XOR trees 290 of each PRBS logic engine 210 to generate a PRBS of a specific data width.

Figure 3:
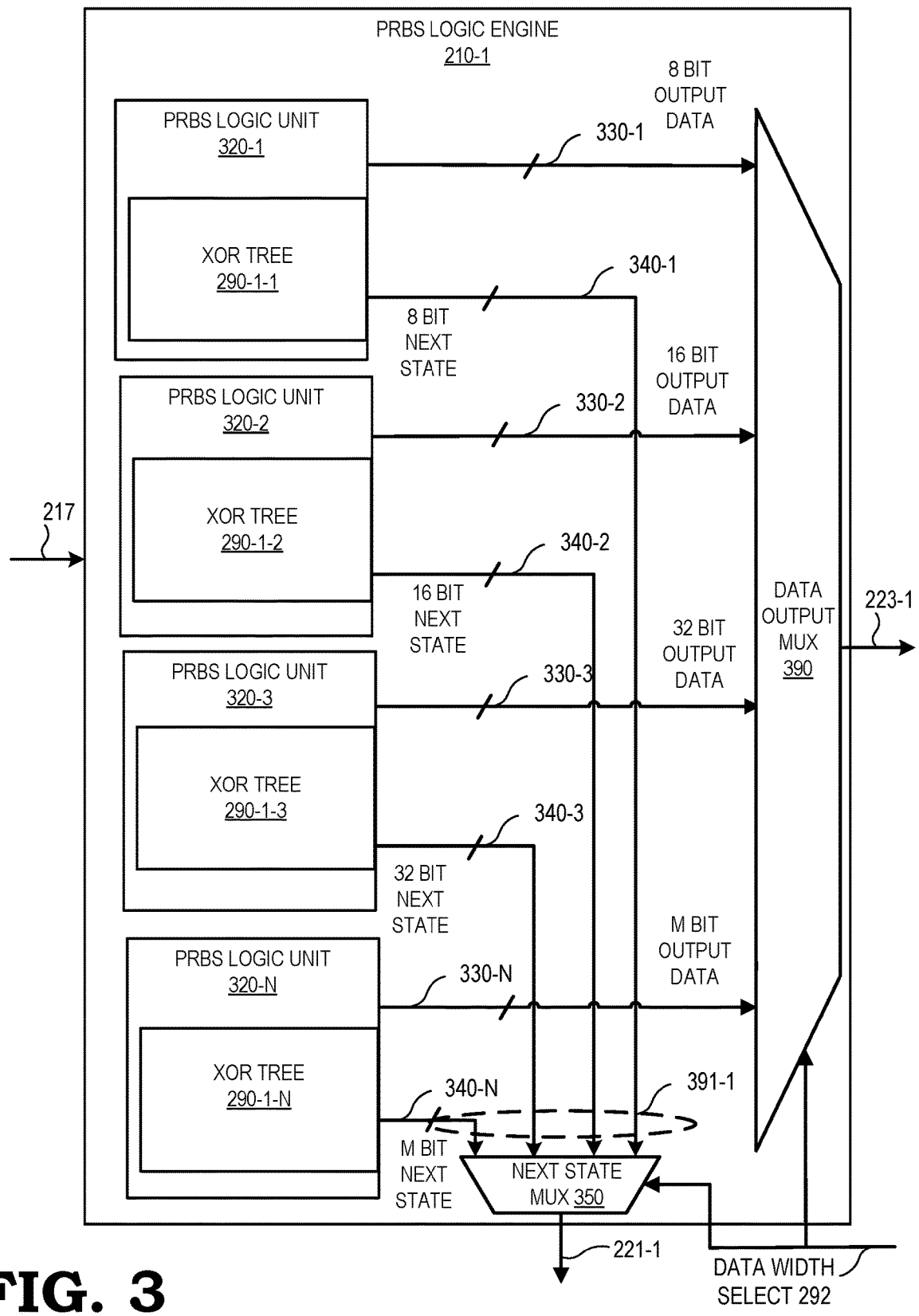
FIG. 3 is a block diagram of a pseudo-random bit sequence logic engine of the pseudo-random bit sequence generator of FIG. 1 in accordance with some embodiments.

FIG. 3 is a block diagram of a PRBS logic engine 210-1 of the PRBS generator 122 of FIG. 1 that is used to generate a PRBS in accordance with some embodiments. PRBS logic engine 210-1 includes PRBS logic units 320-1-PRBS logic units 320-N coupled to a next-state MUX 350 and a data output MUX 390. Next-state MUX 350 is a multiplexer that is configured to select next-state values of the next-state values 340 that are output by the PRBS logic engines 210. Data output MUX 390 is a multiplexer that is configured to select data output from output data 330 that is output by the PRBS logic engines 210. Each PRBS logic unit 320-1-320-N includes an XOR tree 290-1-1-290-1-N, respectively. Each PRBS logic unit 320 is configured to utilize an XOR tree 290-1 to generate both data output 330 and next-state values 340 of a data width specified by data width select signal 292.

In some embodiments, in operation, PRBS logic engine 210-1 receives the data width select signal 292 and uses XOR trees 290-1 of PRBS logic units 320 to generate output data 330 and next-state values 340 at the data width indicated with the data width select signal 292. For example, PRBS logic unit 320-1 utilizes XOR tree 290-1-1 to generate next-state values 340-1 which is used as feedback to PRBS logic engine 210-1 to generate data output 330-1 at the first data width X1. PRBS logic unit 320-2 utilizes XOR tree 290-1-2 to generate next-state values 340-2 which is used as feedback to PRBS logic engine 210-1 to generate output data 330-2 at the second data width X2. PRBS logic unit 320-3 utilizes XOR tree 290-1-3 to generate next-state values 340-3 which is used as feedback to PRBS logic engine 210-1 to generate data output 330-3 at the third data width X3. PRBS logic unit 320-N utilizes XOR tree 291-1-N to generate next-state values 340-N (at a Nth data width XM) which is used as feedback to PRBS logic engine 210-1 to generate data output 330-N at the third data width X3.

In some embodiments, the XOR trees 290-1 of PRBS logic units 320 are constructed using a network of XOR gates (not shown) based on the polynomial corresponding to the PRBS sequence to be output by the PRBS logic engine 210 and the data width selected by the user using data width select signal 292. Each XOR tree 290-1-1-290-1-N of PRBS logic engines 210 inputs only the next-state values of next-state values 217 from the flip-flops 422 (depicted in FIG. 4) in state logic 220 that correspond to the polynomial selected by the user. Thus, for the embodiment depicted in FIG. 3, a PRBS logic engine 210-1 maps to the polynomial that corresponds to the PRBS the user selected using PRBS select signal 214. That is, using data width select signal 292, next-state MUX 350 and data output MUX 390 are used to select the next-state values of next-state values 340 and the data output of output data 330 that corresponds to the requested data width. For an X1 data width (e.g., 8-bit wide data) requested by the user, the PRBS logic unit 320 that corresponds to the X1 data width, i.e., the output of PRBS logic unit 320-1, i.e., 330-1 and 340-1, is selected using next-state MUX 350 and data output MUX 390, respectively. For the X2 data width (e.g., 16-bit wide data), the output of PRBS logic unit 320-2, i.e., 330-2 and 340-2, are selected using next-state MUX 350 and data output MUX 390, respectively. For the X3 data width (e.g., 32-bit wide data), the output of PRBS logic unit 320-3, i.e., 330-3 and 340-3, are selected using next-state MUX 350 and data output MUX 390, respectively. For an XM data width (e.g., M-bit wide data), the output of PRBS logic unit 320-N, i.e., 330-N and 340-N, are selected using next-state MUX 350 and data output MUX 390, respectively. The selected next-state values 221-1 that correspond to the requested data width are provided as feedback to next-state MUX 232 of FIG. 2 to generate the next set of output data 330 and next-state values 340. The selected output data 223-1 is provided as the output of PRBS logic engine 210-1 at the requested data width.

Figure 4:
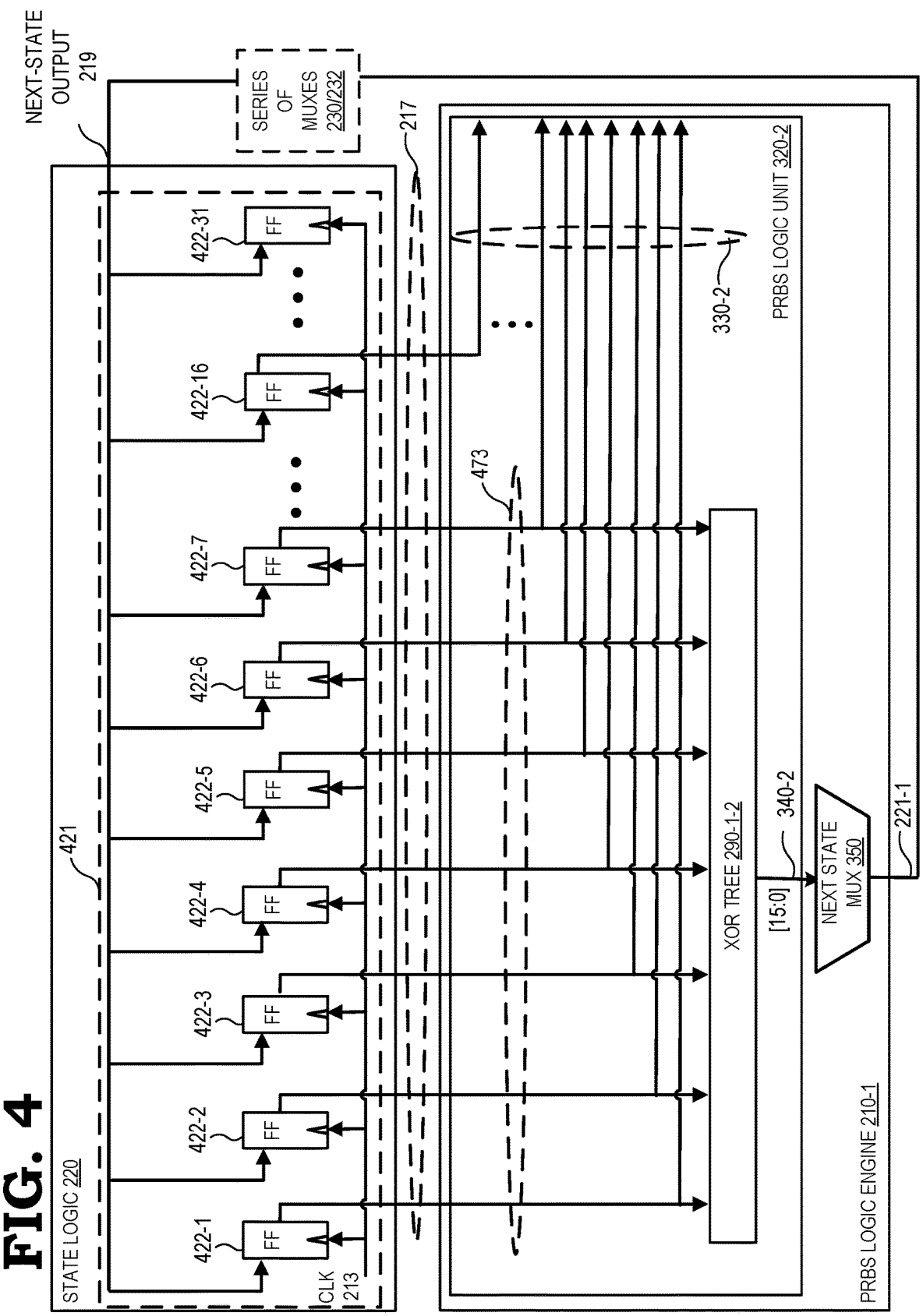
FIG. 4 is a block diagram of a block diagram of a portion of pseudo-random bit sequence logic generator of FIG. 1 in accordance with some embodiments.

FIG. 4 is a block diagram of a portion of PRBS generator 122 of FIG. 1 that is used to generate a PRBS 199 in accordance with some embodiments. The example depicted in FIG. 4 emulates a $7^{th}$ order polynomial with a 16-bit data width using PRBS logic engine 210-1 and state logic 220. Static logic 220 includes a dynamic linear shift bit register (DLFSR) 421 that includes a plurality of flip-flops 422 (in this case, 31 flip-flops). The DLFSR 421 is dynamic in the sense that the output of DLFSR 421 that is provided to XOR trees 290 to generate the PRBS changes depending on, for example, the topology of the PRBS that is selected to generate the PRBS. That is, as stated previously, for example, to generate a PRB S-7, only the output of 7 of the flip-flops of 422 that correspond to the $7^{th}$ order polynomial are provided to XOR tree 290-1 to generate the PRBS-7. To generate a PRBS-9, only the output of 9 of the 31 flip-flops 422 that correspond to the $9^{th}$ order polynomial are provided to, for example, XOR tree 290-2 to generate the PRBS-9. Thus, in some embodiments, only a single set of flip-flops (e.g., flip-flops 422-1 through 422-31) is used to generate the PRBS topologies, as opposed to multiple sets of LFSRs required in other PRBS systems. In some embodiments, the number of flip-flops 422 in DLFSR 421 is equal to the maximum order of the polynomials that are implemented in PRBS generator 122. In the embodiment depicted, the number of flip-flops is 31 (flip-flops 422-1 through 422-31). In some embodiments, although 31 flip-flops are illustrated in state logic 220, an increased or decreased number of flip-flops are implemented in state logic 220 depending on, for example, the number of flip flops available for use in state logic 220.

In some embodiments, in order to generate the 16-bit output data (in this case, output data 330-2) and the 16-bit next-state values (in this case, next-state values 340-2) for the PRBS-7, only the next-state values 473 of next-state values 217 are provided to XOR tree 290-1-2. That is, the output of flip-flops 422 that correspond to the $7^{th}$ order polynomial requested by the user of PRBS generator 122 (e.g., flip-flop 422-1, flip-flop 422-2, flip-flop 422-3, flip-flop 422-4, flip-flop 422-5, flip-flop 422-6, flip-flop 422-7) are provided to XOR tree 290-1-2. XOR tree 290-1-2 receives the output of flip-flops 422-1-422-7 as input to the network of XOR gates (not shown) to generate the 16-bits that yield the next-state values 340-2. The next-state values 340-2 are selected by next-state MUX 350 using data width select signal 292 and provided as the feedback next-state values 221-1 to state logic 220 using next-state MUX 232 and MUX 230. As exemplified in FIG. 4, the output data 330-2 is generated from the next-state values 340-2 that are output from XOR tree 290-1-2 and fed back and stored in flip-flops 422-1-422-16. Output data 330-2 is then selected by data output MUX 390 (FIG. 3) and MUX 231 (FIG. 2) and provided as the requested 16-bit PRBS-7 as PRBS 199.

Figure 5:
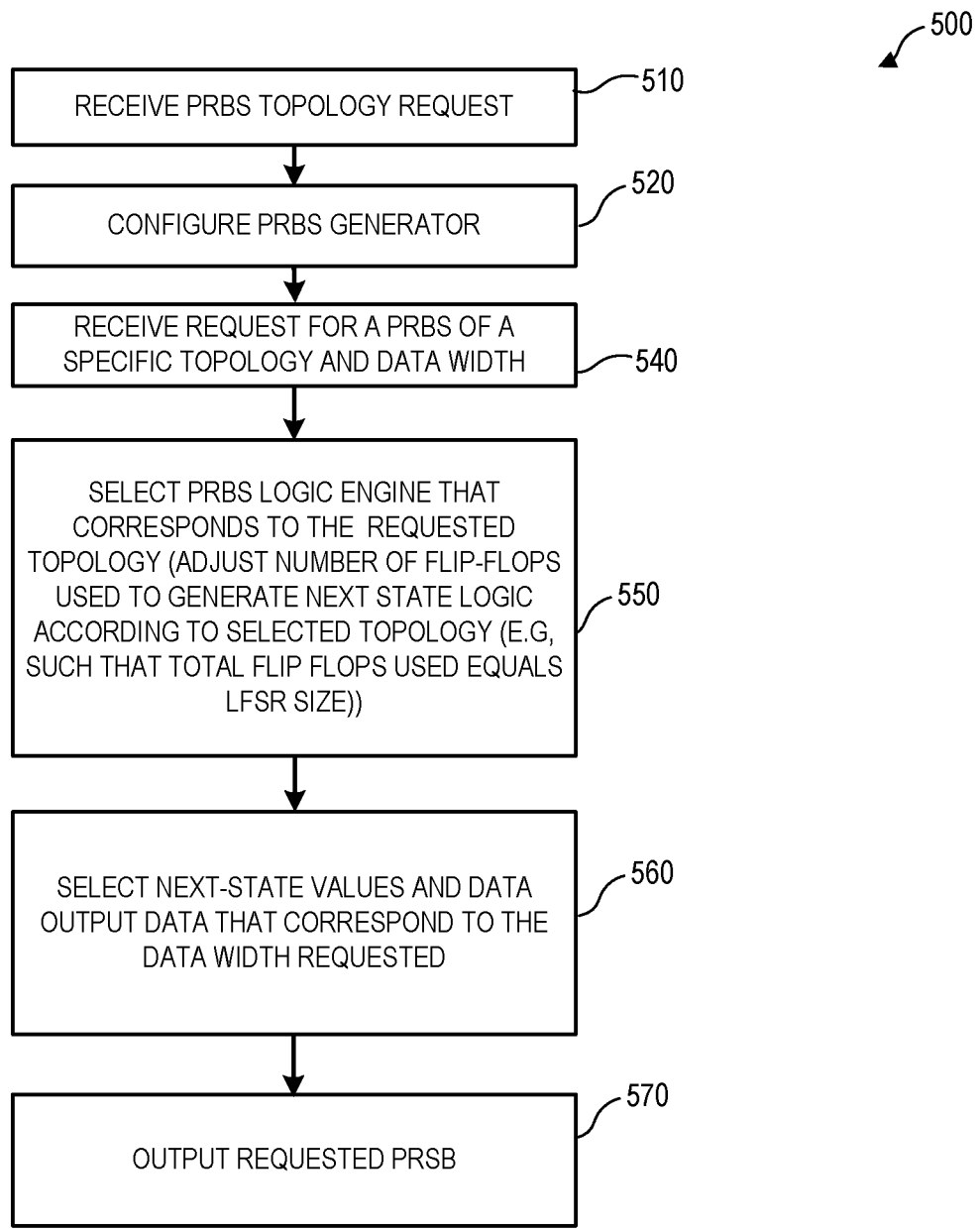
FIG. 5 is a flow diagram illustrating a method generating a pseudo-random bit sequence using the pseudo-random bit sequence generator of FIG. 1 in accordance with some embodiments.

FIG. 5 illustrates a method 500 for generating PRBS 199 using the PRBS generator 122 of processor system of FIG. 1 in accordance with some embodiments. Method 500 is described with reference to FIGS. 1-4. Blocks 510, 520, and 530 are optional (as indicated by the dashed lines) in the sense that, in some embodiments, instead of receiving a topology configuration request from a user of the PRBS generator 122, PRBS generator 122 is preconfigured to a specific set of topologies regulated by, for example, the number of flip-flops 422 available for storage of the next-state values 219. Optionally, at block 510, PRBS generator 122 receives the topology request from, for example, the user of the PRBS generator 122. In some embodiments, the topology request includes a plurality of topologies requested by the user. For example, in some embodiments, a request of 5 topologies (e.g., PRBS-7, PRBS-9, PRBS-15, PRBS-17, PRBS-31) are received by PRBS generator 122. However, in some embodiments, as stated previously, the PRBS generator 122 is preconfigured to a specified number of PRBS topologies. Optionally, at block 530, PRBS generator 122 configures DSPLE 295 to the PRBS topology configuration requested using a PRBS topology configuration. In some embodiments, PRBS generator 122 configures PRBS logic engines 210-1 through 210-N to the designated PRBS topologies by configuring XOR trees 290 of each PRBS logic engine 210 for the requested PRBS and data width.

At block 540, PRBS generator 122 receives a request from PRBS TX control unit 132 for a PRBS of specific PRBS topology and data width to be output by the PRBS generator 122. In some embodiments, the PRBS request is in the form of a PRBS select signal 214 and a data width select signal 292.

At block 550, as exemplified in FIG. 2, PRBS generator 122 selects the output of a PRBS logic engine 210 that corresponds to the PRBS requested using the PRBS select signal 214. In some embodiments, PRBS generator 122 uses a next-state MUX 232 and a MUX 231 to select the output of the PRBS logic engine 210 (i.e., the next-state values 221 and output data 223) that correspond to the PRBS requested using the PRBS select signal 214. In some embodiments, at block 550, the number of flip-flops 422 that are used to generate the output that is fed into the XOR trees 290 is selected to map to the requested topology structure, such that the output of the total number of flip-flops 422 that is input into the XOR trees 290 is equal to the DLFSR size.

At block 560, as exemplified in FIG. 3, PRBS logic engine 210 uses next-state MUX 350 and data output MUX 390 to select the next-state values 340 and the output data 330 that correspond to the data width requested using data width select signal 292. In some embodiments, as stated previously, PRBS logic units (e.g., PRBS logic units 320) in the PRBS logic engines 210 utilize XOR trees 290 that are configured to generate the PRBS of the data width requested using the data width select signal 292. In some embodiments, PRBS generator 122 adjusts the number of flip-flops 420 in DLFSR 421 whose output is provided to the XOR trees 290 to a DLFSR size (e.g., the number of flip-flops whose output is used as input to the XOR trees for the designated PRBS topology) which allows the structure of the DLFSR 421 to map to the DLSFR size requested. At block 570, DLFSR 421 is used in combination with the selected PRBS logic engine 210 to generate the output data 330-2, which is selected by PRBS generator 122 as the PRBS 199.

In some embodiments, the apparatus and techniques described above are implemented in a system including one or more integrated circuit (IC) devices (also referred to as integrated circuit packages or microchips), such as the pseudo-random bit sequence generator described above with reference to FIGS. 1-5. In some embodiments, electronic design automation (EDA) and computer aided design (CAD) software tools are used in the design and fabrication of these IC devices. These design tools typically are represented as one or more software programs. The one or more software programs include code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, in some embodiments, the code representative of one or more phases of the design or fabrication of an IC device are stored in and accessed from the same computer readable storage medium or a different computer readable storage medium.

In some embodiments, a computer readable storage medium includes any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. In some embodiments, the computer readable storage medium is embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above are implemented by one or more processors of a processing system executing software. The software includes one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. In some embodiments, the executable instructions stored on the non-transitory computer readable storage medium are in source code, assembly language code, object code, or other instruction format that is interpreted or otherwise executable by one or more processors.

In some embodiments, note that not all of the activities or elements described above in the general description are required, that a portion of a specific activity or device is not required, and that one or more further activities are performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, in some embodiments, the benefits, advantages, solutions to problems, and any feature(s) that cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above are altered or modified and all such variations are considered within the scope of the disclosed subject matter. Accordingly, the protection sought herein is as set forth in the claims below.

What is claimed is:

1. An apparatus, comprising:
a pseudo-random bit sequence (PRBS) control unit; and
a PRBS generator coupled to the PRBS control unit, wherein, based upon control output provided from the PRBS control unit, the PRBS generator generates a second PRBS by dynamically adjusting from using a first set of flip-flops of a master set of flip-flops that generate a first PRBS to a second set of flip-flops of the master set of flip-flops that generate the second PRBS.

2. The apparatus of claim 1, wherein:
the PRBS generator includes a plurality of PRBS logic engines coupled to a first PRBS multiplexer, the first PRBS multiplexer operable to select either the first PRBS or the second PRBS that is output by the PRBS generator.

3. The apparatus of claim 2, wherein:
the PRBS generator further includes a second PRBS multiplexer coupled to the plurality of PRBS logic engines, the second PRBS multiplexer operable to select either first next-state logic values or second next-state logic values to be provided to a state logic unit coupled to the PRBS logic engines.

4. The apparatus of claim 3, wherein:
the plurality of PRBS logic engines include a first PRBS logic engine and a second PRBS logic engine coupled to the first PRBS multiplexer and the second PRBS multiplexer, wherein the first PRBS logic engine generates the first PRBS and the second PRBS logic engine generates the second PRBS.

5. The apparatus of claim 4, wherein:
the first PRBS logic engine includes a first plurality of PRBS logic units and the second PRBS logic engine includes a second plurality of PRBS logic units, the first plurality of PRBS logic units operable to dynamically generate the first PRBS and the second plurality of PRBS logic units operable to dynamically generate the second PRBS.

6. The apparatus of claim 5, wherein:
the first plurality of PRBS logic units generate the first PRBS based on a first output of the first set of flip-flops and the second plurality of PRBS logic units generate the second PRBS based on a second output of the second set of flip-flops.

7. The apparatus of claim 6, wherein:
the first output of the first set of flip-flops is provided to a first plurality of XOR trees in the first plurality of PRBS logic units to generate the first PRBS and the second output of the second set of flip-flops is provided to a second plurality of XOR trees in the second plurality of PRBS logic units to generate the second PRBS.

8. The apparatus of claim 6, wherein:
the first plurality of PRBS logic units includes a first PRBS logic unit and a second PRBS logic unit, the first PRBS logic unit being used to generate the first PRBS at a first data width and the second PRBS logic unit is used to generate the first PRBS at a second data width.

9. The apparatus of claim 8, wherein:
the first PRBS corresponds to a first polynomial of a first order, and the second PRBS corresponds to a second polynomial of a second order.

10. A method, comprising:
receiving a request at a pseudo-random bit sequence (PRBS) generator to generate a first pseudo-random bit sequence (PRBS);

selecting a first PRBS configuration in the PRBS generator that maps to the first PRBS, the first PRBS configuration corresponding to a first set of flip-flops in a plurality of flip-flops;

generating the first PRBS using the first PRBS configuration; and generating a second PRBS using a second PRBS configuration of the PRBS generator, the second PRBS configuration corresponding to a second set of flip-flops in the plurality of flip-flops.

11. The method of claim 10, further comprising:

adjusting a bit width of the first PRBS to a first width of the first PRBS based on a first output of the first set of flip-flops.

12. The method of claim 11, further comprising:

adjusting the first width to a second width of the second PRBS based on a second output of the second set of flip-flops.

13. The method of claim 12, wherein:

generating the first PRBS includes providing the first output of the first set of flip-flops is provided to a first plurality of XOR trees.

14. The method of claim 13, wherein:

the second output of the second set of flip-flops is provided to a second plurality of XOR trees to generate the second PRBS.

15. The method of claim 14, wherein:

the first PRBS corresponds to a first polynomial of a first order, and the second PRBS corresponds to a second polynomial of a second order.

16. A method, comprising:

implementing a first polynomial of a first order using a first number of flip-flops in a master set of flip-flops to generate a first pseudo-random bit sequence (PRBS); and, implementing a second polynomial of a second order by adjusting the first number of flip-flops used to implement the first polynomial to a second number of flip-flops used to implement the second polynomial in order to generate a second PRBS, wherein the master set of flip-flops includes both the first number of flip-flops and the second number of flip-flops.

17. The method of claim 16, wherein:

a first output of the first number of flip-flops is used to generate the first PRBS and a second output of the second number of flip-flops is used to generate the second PRBS.

18. The method of claim 17, wherein:

a first width of the first PRBS is generated using a first plurality of XOR trees and a second width of the second PRBS is generated using a second plurality of XOR trees.

* * * * *